United States Patent
Kim

(10) Patent No.: US 10,290,807 B2
(45) Date of Patent: May 14, 2019

(54) MASK FRAME ASSEMBLY

(71) Applicant: Samsung Display Co., Ltd., Yongin-si (KR)

(72) Inventor: Yonghwan Kim, Yongin-si (KR)

(73) Assignee: Samsung Dispiay Co., Ltd., Yongin-si (KR)

( * ) Notice: Subject to any disclaimer, the term of this patent is extended or adjusted under 35 U.S.C. 154(b) by 0 days.

(21) Appl. No.: 15/653,471

(22) Filed: Jul. 18, 2017

(65) Prior Publication Data

US 2018/0026189 A1 Jan. 25, 2018

(30) Foreign Application Priority Data

Jul. 19, 2016 (KR) .......................... 10-2016-0091442

(51) Int. Cl.
| | |
|---|---|
| *H01L 51/56* | (2006.01) |
| *C23C 14/04* | (2006.01) |
| *B05C 21/00* | (2006.01) |
| *H01L 51/00* | (2006.01) |
| *H05B 33/10* | (2006.01) |
| *C23C 14/12* | (2006.01) |

(52) U.S. Cl.
CPC ........ *H01L 51/0011* (2013.01); *B05C 21/005* (2013.01); *C23C 14/042* (2013.01); *C23C 14/12* (2013.01); *H01L 51/56* (2013.01); *H05B 33/10* (2013.01)

(58) Field of Classification Search
CPC ........ H01L 51/0002–51/0013; H01L 51/0022; C23C 14/042; C23C 14/044; C23C 16/042; B05C 21/005
See application file for complete search history.

(56) References Cited

U.S. PATENT DOCUMENTS

| 8,550,032 B2 | 10/2013 | Park | |
|---|---|---|---|
| 8,646,406 B2 * | 2/2014 | Ahn ...................... | C23C 14/042 118/505 |
| 2005/0072359 A1 * | 4/2005 | Kim ...................... | C23C 14/042 118/720 |

(Continued)

FOREIGN PATENT DOCUMENTS

| KR | 10-2007-0090018 | 9/2007 |
|---|---|---|
| KR | 10-2009-0053417 | 5/2009 |

(Continued)

*Primary Examiner* — Eric A. Ward

(74) *Attorney, Agent, or Firm* — H.C. Park & Associates, PLC

(57) ABSTRACT

A mask frame assembly includes: a frame having an opening formed therein; a mask including a pattern portion through which the deposition material passes through the mask frame assembly and a rib portion surrounding the pattern portion and configured to block the deposition material, both ends of the mask being installed on the frame; and a support bar that crosses the opening, having both ends thereof installed on the frame and configured to support the rib portion, wherein the mask includes first alignment holes, which are formed in the rib portion and through which the deposition material passes, and the support bar includes second alignment holes configured to overlap with the first alignment holes based on an injection direction of the deposition material.

8 Claims, 7 Drawing Sheets

(56) References Cited

U.S. PATENT DOCUMENTS

2007/0184195 A1\* 8/2007 Hatakeyama ......... C23C 14/042
427/282
2012/0279444 A1 11/2012 Hong
2014/0033974 A1\* 2/2014 Hong ................... B05C 21/005
118/500

FOREIGN PATENT DOCUMENTS

| KR | 10-2011-0069466 | 6/2011 |
| KR | 10-2012-0125035 | 11/2012 |
| WO | 2006/100867 | 9/2006 |

\* cited by examiner

MASK FRAME ASSEMBLY

CROSS-REFERENCE TO RELATED APPLICATION

This application claims priority from and the benefit of Korean Patent Application No. 10-2016-0091442, filed on Jul. 19, 2016, which is hereby incorporated by reference for all purposes as if fully set forth herein.

BACKGROUND

Field

Exemplary embodiments relate to a mask frame assembly used in deposition of a thin film.

Discussion of the Background

In general, organic light-emitting display apparatuses, which realize colors using the principle that holes and electrons respectively injected from an anode and a cathode re-combine in an emission layer and emit light, include pixels having a stack structure in which the emission layer is between a pixel electrode as the anode and an opposite electrode as the cathode.

Each of the pixels may be a sub-pixel from among red pixels, green pixels, and blue pixels, for example, and a desired color may be represented by a combination of colors of these three sub-pixels. That is, each sub-pixel has a structure in which an emission layer for emitting light of one color from among red, green, and blue is between two electrodes, and color of one unit pixel is represented by an appropriate combination of the three colors of light.

Meanwhile, regions of each sub-pixel are divided by a pixel-defining layer (PDL), and the emission layer is formed in the divided regions. The emission layer is generally formed using deposition. That is, a mask frame assembly having the same pattern hole as a thin film pattern of the emission layer to be formed is aligned on a substrate, and a thin film having a desired pattern is formed by depositing a raw material of the thin film on the substrate through the pattern hole.

However, a so-called shadow phenomenon may occur when the thin film pattern of the emission layer is not precisely deposited only in regions of the pattern hole of the mask frame assembly, but is deposited into outer regions excluding the pattern hole when deposition is performed. When such a shadow phenomenon is severe, mixed color between adjacent sub-pixels may be produced, which results in defective products.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments include a mask frame assembly having an improved structure in which a shadow phenomenon may be effectively prevented.

Additional aspects will be set forth in part in the description which follows and, in part, will be apparent from the disclosure, or may be learned by practice of the inventive concepts.

According to one or more exemplary embodiments, a mask frame assembly, by which a part of a deposition material injected from a deposition source passes through the mask frame assembly and the other part of the deposition material is blocked so that the deposition material is deposited in an effective area of a substrate, is disclosed. The mask frame assembly includes: a frame having an opening formed therein; a mask including a pattern portion configured for a deposition material to pass through the mask frame assembly, and a rib portion surrounding the pattern portion and configured to block the deposition material, both ends of the mask being installed on the frame; and a support bar configured to support the rib portion, the support bar having both ends thereof installed on the frame to cross the opening, wherein the mask includes first alignment holes, which are formed in the rib portion and through which the deposition material passes, and the support bar includes second alignment holes configured to overlap with the first alignment holes based on an injection direction of the deposition material.

The substrate may include alignment keys adjacent to the first alignment holes and the second alignment holes based on the injection direction of the deposition material, and a deposition position of the deposition material deposited on the substrate while sequentially passing through the first alignment holes and the second alignment holes and a position of the alignment keys may be compared to each other so that the substrate and the mask are aligned with each other.

The alignment keys may include a plurality of reference lines, and the first alignment holes may be formed at different positions of the mask so that the deposition material is deposited adjacent to one of the plurality of reference lines.

The alignment keys may include a plurality of reference lines, and the second alignment holes may be formed at different positions of the support bar so that the deposition material is deposited adjacent to one of the plurality of reference lines.

The frame may include an accommodation groove for accommodating both ends of the support bar, and both ends of the support bar may be accommodated in the accommodation groove and may be combined with the frame.

At least a part of the deposition material that passes through the first alignment holes may pass through the second alignment holes.

The mask may cross the support bar at right angles.

The mask may include at least one strip mask.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
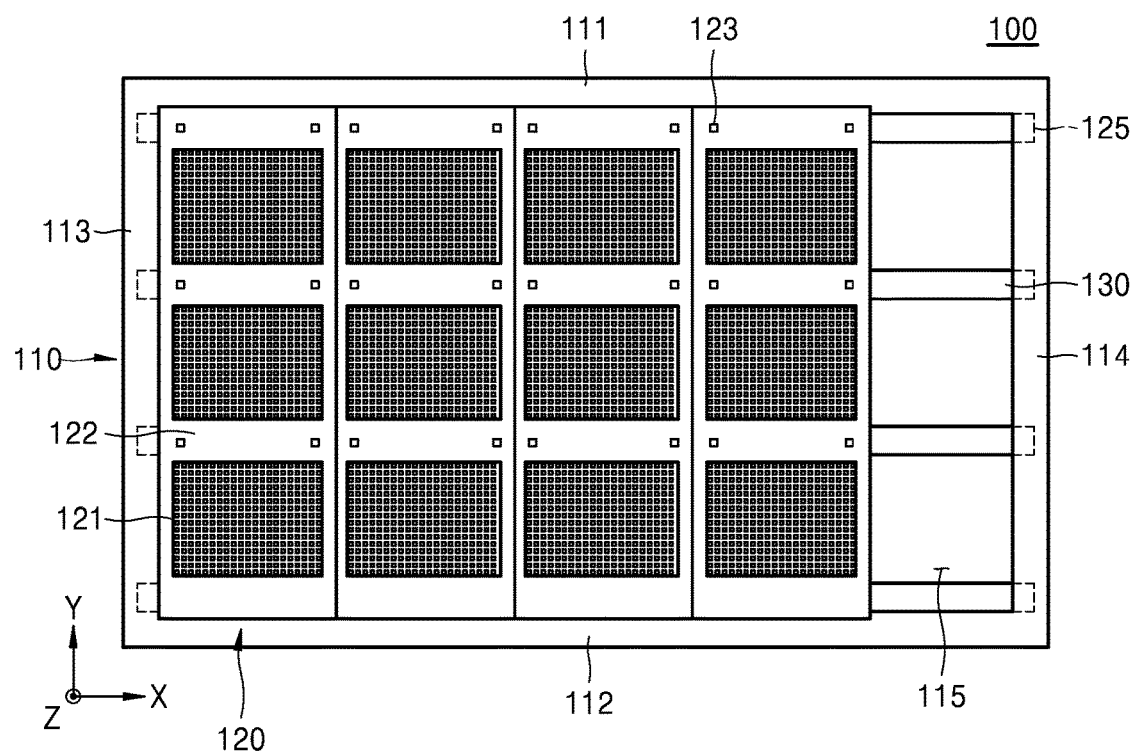
FIG. 1 is a plan view of one surface of a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
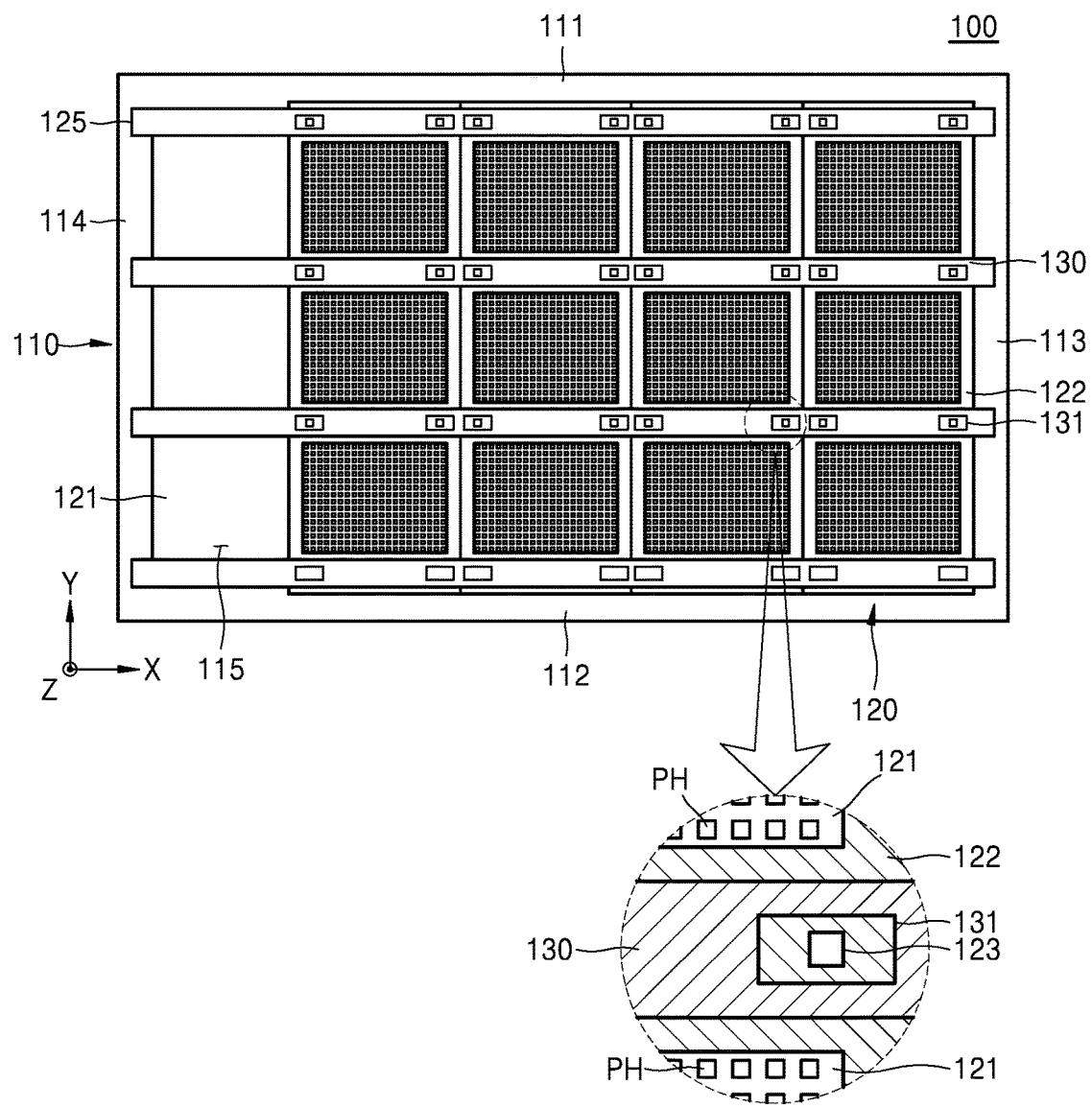
FIG. 2 is a plan view of the other surface of the mask frame assembly of FIG. 1.

FIG. 1 is a plan view of one surface of a mask frame assembly according to an exemplary embodiment, and FIG. 2 is a plan view of the other surface of the mask frame assembly of FIG. 1.

Referring to FIGS. 1 and 2, a mask frame assembly 100 according to an exemplary embodiment includes a frame 110, a mask 120, and a support bar 130.

The frame 110 has an opening 115 formed therein and includes a plurality of frames, for example, first to fourth frames 111 to 114, that surround the opening 115. Here, the opening 115 of the frame 110 illustrated in FIGS. 1 and 2 has a rectangular shape in the center thereof. However, exemplary embodiments are not limited thereto. According to an exemplary embodiment, the opening 115 may have various shapes such as a circular shape, an oval shape, and a polygonal shape. However, hereinafter, for convenience of explanation, the case where the opening 115 has a rectangular shape will be described in detail.

In detail, the frame 110 may include the first frame 111 and the second frame 112 that face each other in an Y-axis direction and extend along an X-axis direction, and the third frame 113 and the fourth frame 114 that face each other in the X-axis direction and extend along the Y-axis direction.

Each of the first frame 111 and the second frame 112 has a first length, and each of the third frame 113 and the fourth frame 114 has a second length that is less than the first length. The first frame 111, the second frame 112, the third frame 113, and the fourth frame 114 may be connected to one another and may constitute a rectangular frame.

The frame 110 may be formed of a material having a small amount of strain when being welded to the mask 120, for example, a metal having large rigidity. Although not shown, a welding portion (not shown) formed by welding the frame 110 and the mask 120 to each other is formed on the frame 110, and because high-temperature heat is generated around the welding portion, the frame 110 may be formed of a material having a small thermal strain.

The mask 120 may be a strip-type mask divided into a plurality of parts and may be installed at the frame 110 while both ends of the mask 120 are in a tensile state. The reason why the mask 120 in the tensile state is installed at the frame 110, is that, when the mask 120 having a large size is manufactured, the mask 120 may sag towards the center opening 115 due to the weight of the mask 120. When the mask 120 sags, the degree of deposition precision of a deposition material to be deposited on a target substrate S through the mask 120 is deteriorated, and a shadow phenomenon occurs, which is a risk of mixing colors between sub-pixels.

The mask 120 may include a pattern portion 121 through which the deposition material passes through the mask frame assembly 100, and a rib portion 122 that surrounds pattern portion 121 and blocks the deposition material.

The pattern portion 121 may include a plurality of pattern holes PH in regular patterns through which the deposition material passes through the mask frame assembly 100. The deposition material that passes through the plurality of pattern holes PH is deposited in an effective area (see DA of FIG. 3) of the target substrate (see S of FIG. 3) so that an emission layer (see 226 of FIG. 7) of an organic light-emitting device (see OLED of FIG. 7) may be formed.

The rib portion 122 that is an element for forming the other area than the pattern portion 121 through which the deposition material passes through, i.e., the body of the mask 120, is used to block the deposition material. However, the mask 120 of the mask frame assembly 100 according to an exemplary embodiment may include first alignment holes 123, which are formed in the rib portion 122 and through which the deposition material passes through the mask frame assembly 100.

In detail, the first alignment holes 123 are elements provided in the mask 120 to precisely align the target substrate S and the mask 120 with each other, and the deposition material that passes through the first alignment holes 123 may be deposited in the vicinity of alignment keys (see AK of FIG. 3) of the target substrate S. A deposition position of the deposition material deposited in the vicinity of the alignment keys AK of the target substrate S after passing through the first alignment holes 123, and the position of the alignment keys AK are compared to each other so that the target substrate S and the mask 120 may be aligned with each other.

In this way, when the target substrate S and the mask 120 are precisely aligned with each other and a deposition process is performed, the deposition material deposited in the effective area DA of the target substrate S, i.e., an emission layer 226 is precisely deposited at a designed position so that mixing colors with other adjacent emission layers 226 may be prevented. A structure of the target substrate S will be described below with reference to FIG. 3 in detail.

The mask 120 may be manufactured by etching. That is, the mask 120 may be manufactured by forming a photoresist layer having the same pattern as that of each of the pattern holes PH on a thin film using photoresist or etching a thin film after a film having the pattern of each pattern hole PH is attached to the thin film. In addition, the mask 120 may also be manufactured by electro-forming or electroless plating.

In detail, the mask 120 that is a thin film having magnetism may be formed of stainless steel, invar, nickel (Ni), cobalt (Co), a nickel alloy, a nickel-cobalt alloy, or the like. In an example, the mask 120 may be formed of a nickel-cobalt alloy that may easily form a fine pattern and has excellent surface roughness.

The number or arrangement position and shape of pattern holes PH illustrated in the drawing is just an example. According to an exemplary embodiment, overall, the pattern holes PH may be open patterns or stripe-shaped patterns.

The support bar 130 may cross the opening 115 and may be installed at the frame 110 while a tensile force is applied to both ends of the support bar 130. Also, the support bar 130 supports the rib portion 122 while being in contact with one surface of the rib portion 122 of the mask 120 so that a phenomenon in which the mask 120 sags due to its weight may be prevented.

In FIGS. 1 and 2, the frame 110 and the support bar 130 are integrally connected to each other. However, exemplary embodiments are not limited thereto. That is, the frame 110 may include an accommodation groove 125 for accommodating both ends of the support bar 130. Both ends of the support bar 130 may be accommodated in the accommodation groove 125 of the frame 110 and may be combined with the frame 110. The support bar 130 may be connected to the frame 110 in various ways. In an example, the support bar 130 may be connected to the frame 110 by welding.

In detail, the support bar 130 may extend in the X-axis direction that crosses the mask 120, and one end of the support bar 130 may be installed at the third frame 113, and the other end of the support bar 130 may be installed at the fourth frame 114. That is, each of the third frame 113 and the fourth frame 114 may have an accommodation groove 125 for accommodating both ends of the support bar 130. As described above, the support bar 130 is installed at the frame 110 while a tensile force is applied to both ends of the support bar 130. This is the same reason why the mask 120 is installed at the frame 110 while being in a tensile state, as described above.

According to an exemplary embodiment, the support bar 130 includes second alignment holes 131 that overlap with the first alignment holes 123 formed in the mask 120 based on an injection direction (Z-axis direction) of the deposition material. According to this structure, the deposition material that passes through the first alignment holes 123 may be injected to the target substrate S via the second alignment holes 131.

In FIGS. 1 and 2, the second alignment holes 131 are larger than the first alignment holes 123. However, exemplary embodiments are not limited thereto. For example, the first alignment holes 123 may be larger than the second alignment holes 131. Also, the sizes of the first alignment holes 123 and the second alignment holes 131 may be the same. Here, the formation of an area in which the first alignment holes 123 and the second alignment holes 131 overlap with each other, in detail, an area, in which the first alignment holes 123 and the second alignment holes 131 overlap with each other so that the deposition material passes through the overlapping area, is important, and the sizes of the first alignment holes 123 and the second alignment holes 131 are not important.

Hereinafter, the variation of the position of the deposition material to be deposited on the target substrate S according to the formation structure of the first alignment holes 123 of the mask 120 and the second alignment holes 131 of the support bar 130 and the alignment between the target substrate S and the mask 120 according to the varying position of the deposition material is described with reference to FIGS. 3 through 6 in detail.

Figure 3:
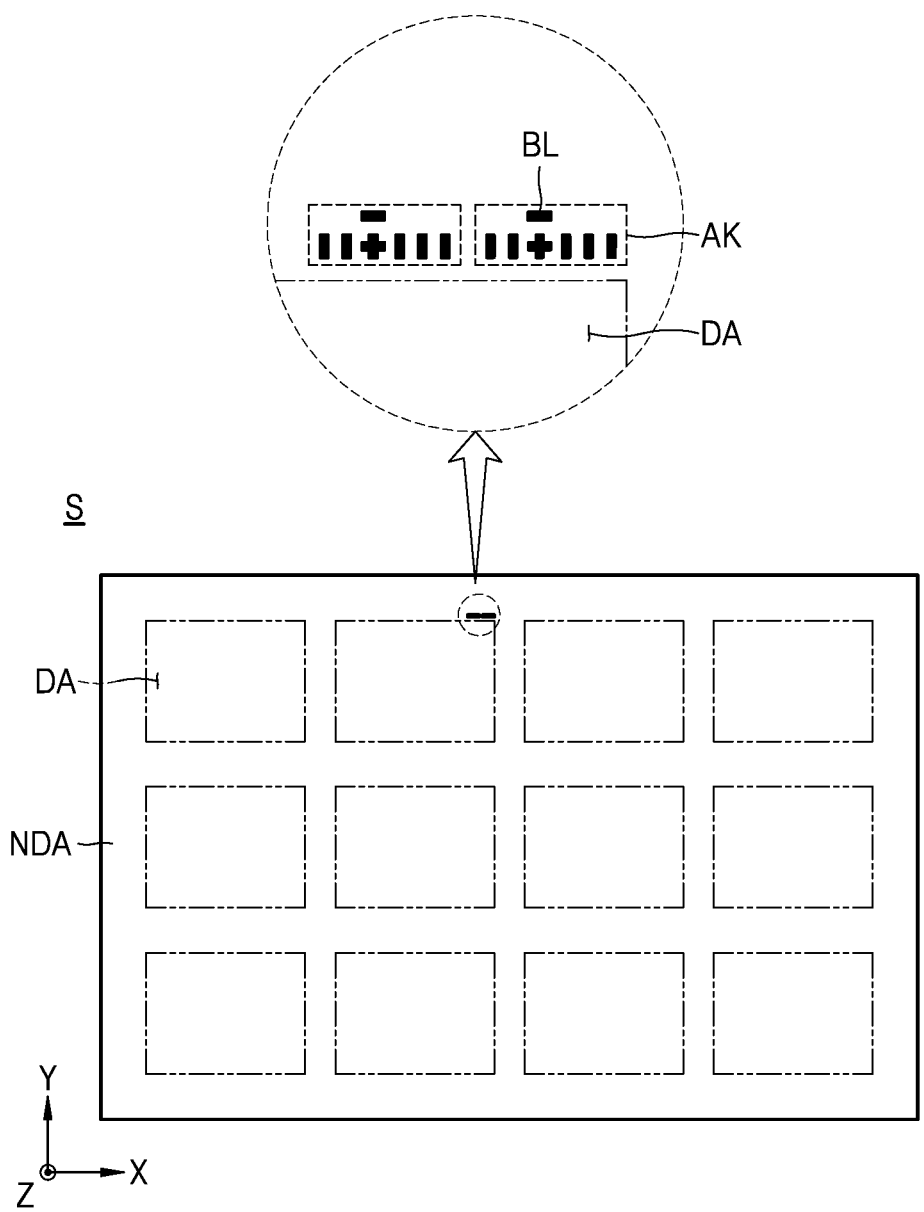
FIG. 3 is a plan view of a substrate on which a deposition material that passes through the mask frame assembly of FIG. 1, is deposited.
Figure 4:
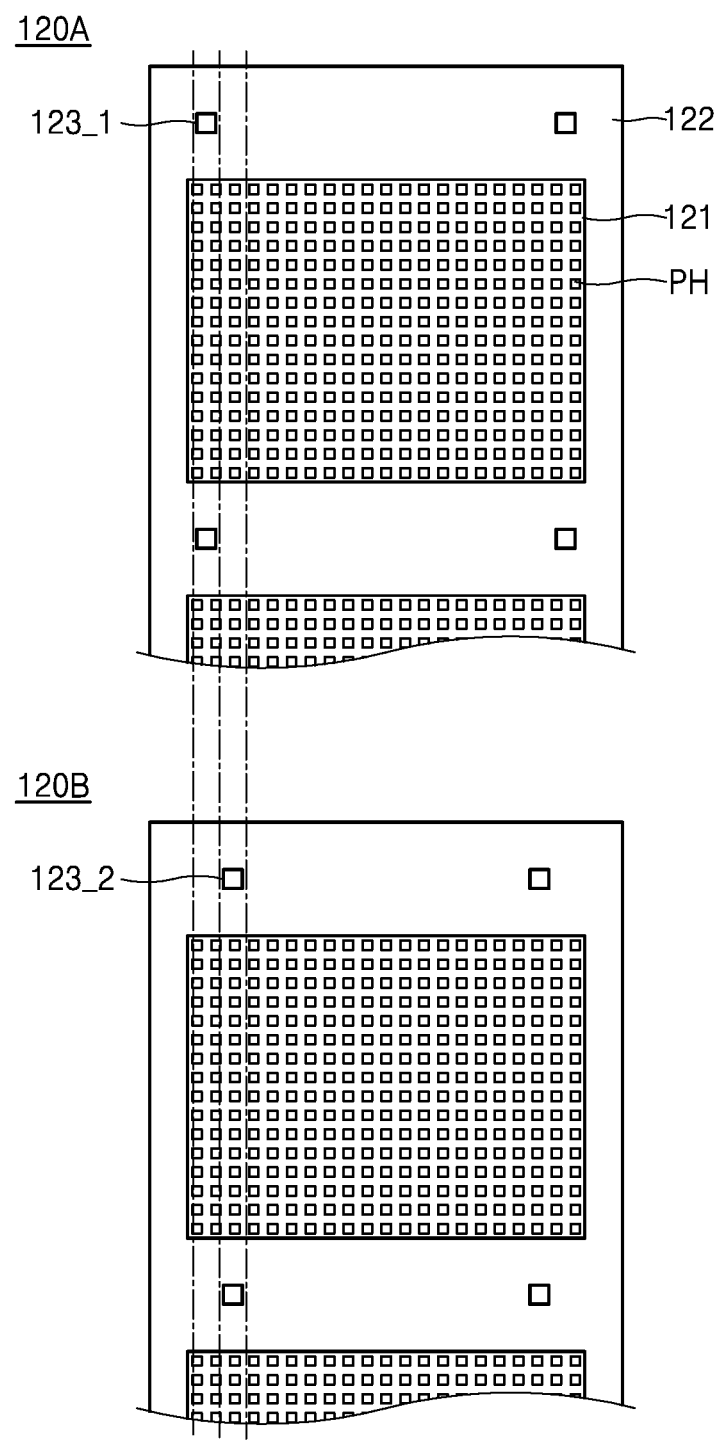
FIG. 4 is a partial plan view of a state in which first alignment holes are formed at different positions of a mask illustrated in FIG. 1.
Figure 5:
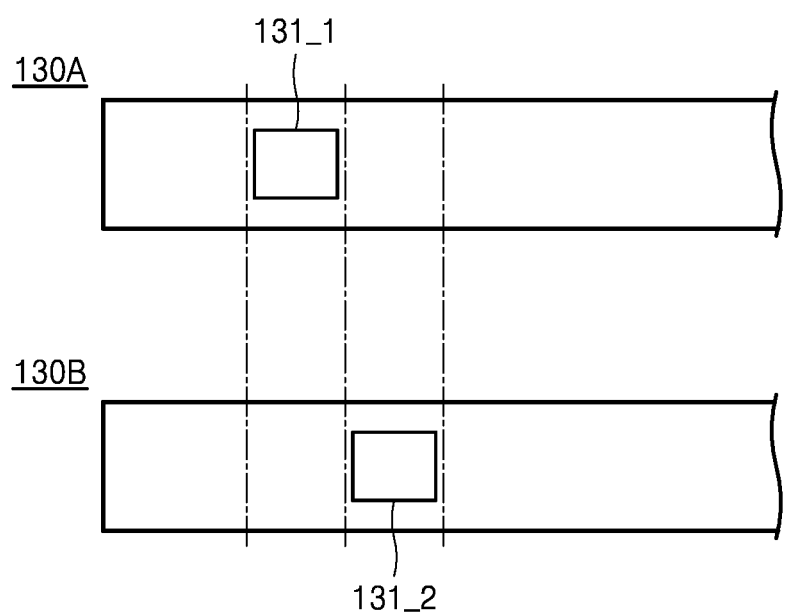
FIG. 5 is a partial plan view of a state in which second alignment holes are formed at different positions of a support bar illustrated in FIG. 1.
Figure 6:
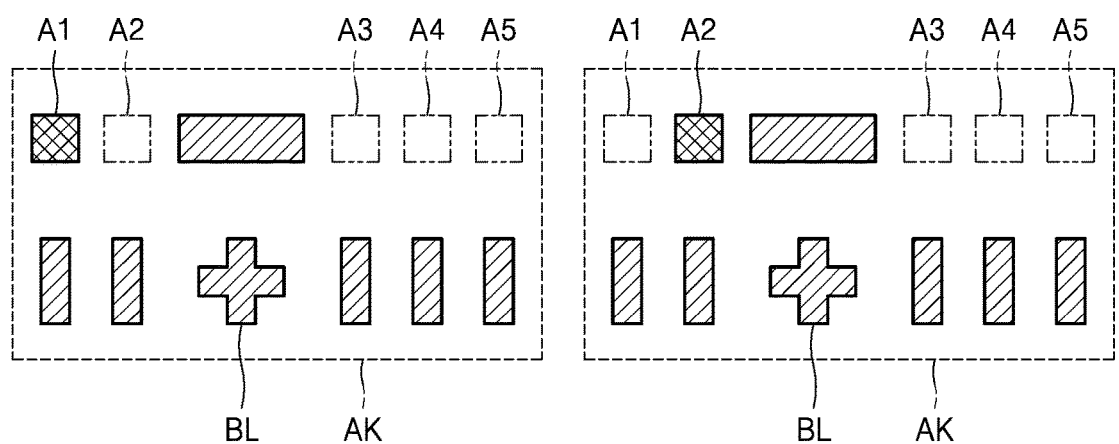
FIG. 6 is a plan view of a state in which the deposition material that passes through the mask frame assembly of FIG. 1 is deposited on alignment keys of the substrate.

FIG. 3 is a plan view of a substrate on which the deposition material that passes through the mask frame assembly 100 of FIG. 1 is deposited, and FIG. 4 is a partial plan view of a state in which first alignment holes are formed at different positions of the mask 120 illustrated in FIG. 1, and FIG. 5 is a partial plan view of a state in which second alignment holes are formed at different positions of the support bar 130 illustrated in FIG. 1, and FIG. 6 is a plan view of a state in which the deposition material that passes through the mask frame assembly 100 of FIG. 1 is deposited on the alignment keys AK of the target substrate S.

Figure 7:
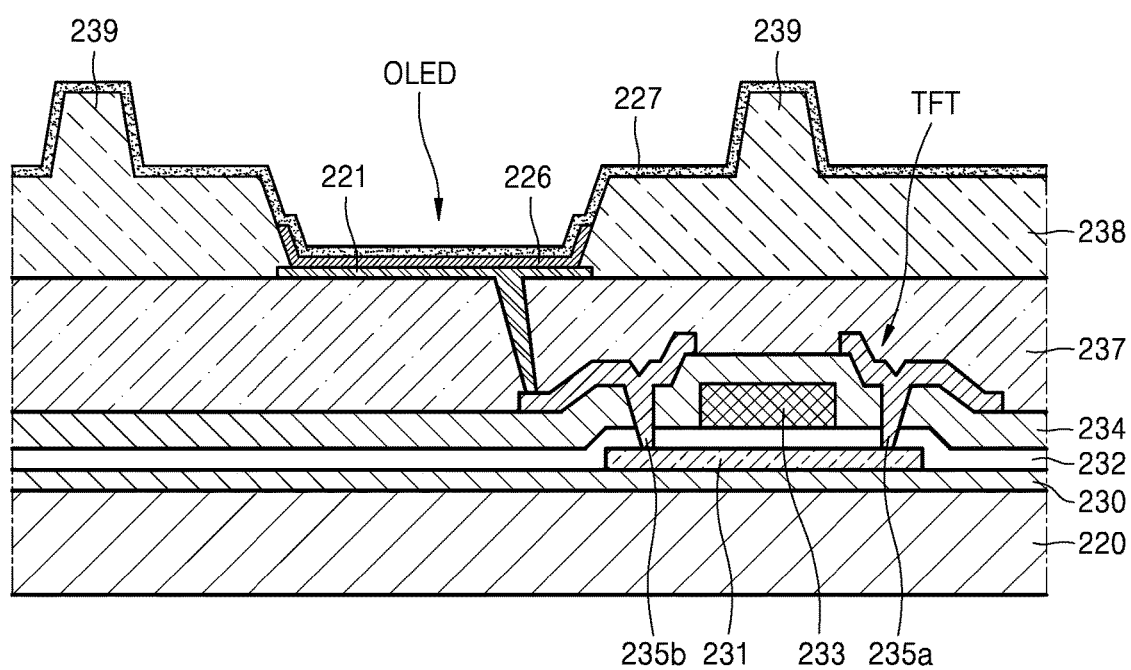
FIG. 7 is a cross-sectional view of a detailed structure of the substrate illustrated in FIG. 3.

The target substrate S shown in FIG. 3 that is the same element as that of reference numeral 220 of FIG. 7 may include a glass substrate, a plastic substrate or a flexible film substrate. Also, the target substrate S may be transparent, semi-transparent or opaque.

The target substrate S is divided into an effective area DA in which the deposition material is deposited, and a non-effective area NDA in which the deposition material is not deposited. In detail, the deposition material that passes through the pattern holes PH formed in the pattern portion 121 of the mask 120 may be deposited in the effective area DA. In general, in the non-effective area NDA, the deposition material is blocked by the rib portion 122 of the mask 120 and thus is not deposited in the non-effective area NDA. However, exceptionally, the deposition material that passes through the first alignment holes 123 of the mask 120 and the second alignment holes 131 of the support bar 130 may be deposited in the non-effective area NDA of the target substrate S.

The alignment keys AK may be formed in the non-effective area NDA of the target substrate S adjacent to the first alignment holes 123 and the second alignment holes 131 based on the injection direction (Z-axis) of the deposition material. The deposition material that sequentially passes through the first alignment holes 123 and the second alignment holes 131 may be deposited directly on the alignment keys AK.

In detail, referring to FIG. 6, the alignment keys AK may include a plurality of reference lines BL, and the deposition material that passes through the first alignment holes 123 and the second alignment holes 131 sequentially, may be deposited at a position (reference numeral A1, A2, A3, A4 or A5) adjacent to the reference lines BL In general, the mask frame assembly 100 according to an exemplary embodiment may include a plurality of parts. In this case, the first alignment holes 123 and the second alignment holes 131 may be formed at different positions of each mask frame assembly 100.

According to an exemplary embodiment, a deposition material to be deposited on the target substrate S may be prepared as a plurality of different materials that may emit different colors. Each deposition material including the plurality of different materials may pass through different mask frame assemblies 100 in different chambers (not shown) and may be deposited on the target substrate S.

In this case, a worker or an automatic control device (for example, a computer) monitors continuously whether each deposition material is precisely deposited at a designed position of the target substrate S. If each deposition material is deposited at different positions excluding the designed position, the worker or automatic control device may adjust the position of the mask frame assembly 100 so that the deposition material may be precisely deposited at the designed position of the target substrate S.

The first alignment holes 123 formed in the mask 120 and the second alignment holes 131 formed in the support bar 130 may be used to monitor whether the deposition material is precisely deposited at the designed position of the target substrate S.

Two masks 120A and 120B illustrated in FIG. 4 show the case where first alignment holes 123_1 and 123_2 are formed at different positions. FIG. 5 illustrates support bars 130A and 130B having second alignment holes 131_1 and 131_2 formed at different positions.

Here, it is assumed that the first alignment holes 123_1 and the second alignment holes 123_2 formed more towards a left side overlap with each other and similarly, the first alignment holes 123_1 and the second alignment holes 123_2 formed more towards a right side overlap with each other.

The deposition material that passes through the first alignment holes 123_1 and the second alignment holes 123_2 sequentially may be deposited in an area corresponding to reference numeral A1 of the alignment keys AK of the target substrate S shown in FIG. 6. Meanwhile, the deposition material that passes through the first alignment holes 123_1 and the second alignment holes 123_2 formed more towards the right side may be deposited in an area corresponding to reference numeral A2 of the alignment keys AK shown in FIG. 6. Here, the deposition materials deposited at reference numerals A1 and A2 may be materials that emit different colors.

Although not shown, the first alignment holes 123_1 and 123_2 illustrated in FIG. 4 may be formed in a different position, such as more towards a left side or right side, as compared to the position shown in the drawing. Similarly, the second alignment holes 131_1 and 131_2 illustrated in FIG. 5 may be formed more towards the left side or right side, as compared to the position shown in the drawing.

Here, particular positions of the first alignment holes 123 and the second alignment holes 131 are not important. However, it is important that the deposition material that passes through the first alignment holes 123 and the second alignment holes 131 is deposited at the deposition position indicated in the alignment keys AK of FIG. 6, i.e., at one of reference numerals A1, A2, A3, A4, and A5. That is, the first alignment holes 123 and the second alignment holes 131 may be formed at different positions of the mask 120 or the support bar 130 so that the deposition material may be deposited at a position adjacent to one of the plurality of reference lines BL formed in the alignment keys AK of FIG. 6.

In this way, the deposition material deposited at one of reference numerals A1, A2, A3, A4, and A5 of FIG. 6 while sequentially passing through the first alignment holes 123 and the second alignment holes 131 may be adjacent to the reference lines BL of the alignment keys AK. In this way, the deposition position of the deposition material deposited at one of reference numerals A1, A2, A3, A4, and A5 of FIG. 6 and the position of the reference lines BL formed in the alignment keys AK are compared to each other so as to monitor whether the deposition material is precisely deposited at the designed position of the target substrate S.

Here, the structures and positions of the alignment keys AK and the reference lines BL of FIG. 6 are just an example, and the alignment keys AK and the reference lines BL may be formed at different positions from the arrangement shown in the drawing.

FIG. 7 is a schematic view of a structure of an organic light-emitting display apparatus that is an example of a target substrate S or 220 on which a deposition material may be deposited using the mask frame assembly 100 according to an exemplary embodiment.

FIG. 7 is a cross-sectional view of a detailed structure of the target substrate S shown in FIG. 3.

Referring to FIG. 7, a buffer layer 230 is formed on the substrate 220, and a thin film transistor (TFT) is disposed on the buffer layer 230.

The TFT includes an active layer 231, a gate insulating layer 232 covering the active layer 231, and a gate electrode 233 on the gate insulating layer 232.

An interlayer insulating layer 234 is formed to cover the gate electrode 233, and a source electrode 235a and a drain electrode 235b are formed on the interlayer insulating layer 234.

The source electrode 235a and the drain electrode 235b are in contact with a source region and a drain region of the active layer 231 via a contact hole formed in the gate insulating layer 232 and the interlayer insulating layer 234.

A pixel electrode 221 of an organic light-emitting device (OLED) is connected to the drain electrode 235b. The pixel electrode 221 is formed on a planarization layer 237, and a pixel-defining layer (PDL) 238 for defining sub-pixel regions is formed on the pixel electrode 221.

Reference numeral 239 denotes a spacer for preventing damage to elements on the substrate 220 due to contact with the mask 120 by maintaining a distance from the mask 120 when deposition is performed, and the spacer 239 may be formed to have a shape of a protrusion part of the PDL 238.

An emission layer 226 of the OLED is formed on an opening of the PDL 238, and an opposite electrode 227 is deposited on the emission layer 226 and the PDL 238. That is, the opening defined by the PDL 238 is one sub-pixel region such as a red pixel R, a green pixel G, and a blue pixel B, and the emission layer 226 having one of red, green, blue colors is formed in the region.

Thus, when the mask frame assembly 100 is prepared in such a way that the pattern holes PH formed in the pattern portion 121 of the mask 120 may correspond to the emission layer 226, the emission layer 226 having a desired pattern may be formed using a deposition process. A unit cell may be one display region of an organic light-emitting display apparatus.

As described above, in a mask frame assembly according to the exemplary embodiments, a mask and a substrate may be precisely aligned with each other so that a problem of mixed color between pixels may be effectively prevented. Thus, when the mask frame assembly is used in a deposition process, the quality of a product may be assured.

Of course, the scope of the exemplary embodiments is not limited by these effects.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A mask frame assembly, comprising:
a frame having an opening formed therein;
a mask comprising a pattern portion configured for a deposition material to pass through the mask frame assembly, and a rib portion surrounding the pattern portion and configured to block the deposition material, both ends of the mask being installed on the frame; and
a support bar configured to support the rib portion, the support bar having both ends thereof installed on the frame to cross the opening,
wherein:
the mask comprises first alignment holes, which are formed in the rib portion and through which the deposition material passes;
the support bar comprises second alignment holes configured to overlap with the first alignment holes based on an injection direction of the deposition material, and
the first alignment holes and the second alignment holes are configured to overlap in a one-to-one correspondence.

2. The mask frame assembly of claim 1, wherein the substrate comprises alignment keys adjacent to the first alignment holes and the second alignment holes based on the injection direction of the deposition material, and a deposition position of the deposition material deposited on a substrate while sequentially passing through the first alignment holes and the second alignment holes and a position of the alignment keys are configured for alignment of the substrate and the mask relative to each other.

3. The mask frame assembly of claim 2, wherein the alignment keys comprise a plurality of reference lines, and the first alignment holes are formed at different positions of the mask so that the deposition material is deposited adjacent to one of the plurality of reference lines.

4. The mask frame assembly of claim 2, wherein the alignment keys comprise a plurality of reference lines, and the second alignment holes are formed at different positions of the support bar so that the deposition material is deposited adjacent to one of the plurality of reference lines.

5. The mask frame assembly of claim 1, wherein the frame comprises accommodation grooves for accommodating both ends of the support bar, and both ends of the support bar are accommodated in the accommodation grooves and are combined with the frame.

6. The mask frame assembly of claim 1, wherein at least a part of the deposition material that passes through the first alignment holes passes through the second alignment holes.

7. The mask frame assembly of claim 1, wherein the mask crosses the support bar at right angles.

8. The mask frame assembly of claim 1, wherein the mask comprises at least one strip mask.

* * * * *